US010986746B2

United States Patent
Chao et al.

(10) Patent No.: US 10,986,746 B2
(45) Date of Patent: Apr. 20, 2021

(54) POWER SUPPLY DEVICE WITH PCB POSITIONING FUNCTION AND METHOD FOR MANUFACTURING THE SAME

(71) Applicant: DELTA ELECTRONICS, INC., Taoyuan (TW)

(72) Inventors: Po-Heng Chao, Taoyuan (TW); Jui-Ching Lee, Taoyuan (TW); Ching-Ho Chou, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/198,891

(22) Filed: Nov. 23, 2018

(65) Prior Publication Data
US 2019/0373749 A1  Dec. 5, 2019

(30) Foreign Application Priority Data
Jun. 5, 2018  (CN) .......................... 201810569836.1

(51) Int. Cl.
*H05K 5/06* (2006.01)
*H05K 7/14* (2006.01)
*H05K 7/20* (2006.01)

(52) U.S. Cl.
CPC ............. *H05K 5/064* (2013.01); *H05K 5/069* (2013.01); *H05K 7/1427* (2013.01); *H05K 7/2089* (2013.01)

(58) Field of Classification Search
CPC ...... H05K 7/1427; H05K 5/069; H05K 5/064; H05K 7/2089
See application file for complete search history.

(56) References Cited

U.S. PATENT DOCUMENTS

| 4,706,819 A * | 11/1987 | Elliott ................. H05K 7/1418 211/41.17 |
| 6,178,094 B1 * | 1/2001 | Hakozaki ............. H05K 7/1418 16/95 R |
| 7,140,885 B2 * | 11/2006 | Kitamura ............. H05K 5/0039 439/76.1 |

(Continued)

FOREIGN PATENT DOCUMENTS

| CN | 203365699 U | 12/2013 |
| CN | 105075414 A | 11/2015 |

(Continued)

OTHER PUBLICATIONS

Anonymous: Sleeve cap for edge-connected modules,Research Disclosure, Kenneth Mason Publications, Hampshire, UK, GB,vol. 306, No. 63,Oct. 1, 1989 (Oct. 1, 1989), XP007114285, ISSN: 0374-4353.

*Primary Examiner* — Hoa C Nguyen
*Assistant Examiner* — Keith DePew
(74) *Attorney, Agent, or Firm* — CKC & Partners Co., LLC

(57) ABSTRACT

A power supply device with PCB-positioning features includes a casing, a PCB (Printed Circuit Board) and at least one pair of slots. The casing defines an accommodating space and has at least one opening. The PCB is disposed in the accommodating space and has electronic elements thereon. The at least one pair of slots is disposed at inner walls of the casing for positioning the PCB. A gel-fillable channel is defined between the electronic elements and the inner walls of the casing.

13 Claims, 6 Drawing Sheets

(56) References Cited

U.S. PATENT DOCUMENTS

| | | | | |
|---|---|---|---|---|
| 7,413,463 | B2* | 8/2008 | Matsuo | H05K 5/0039 |
| | | | | 439/377 |
| 7,417,868 | B2* | 8/2008 | Morisada | H05K 7/1405 |
| | | | | 361/741 |
| 7,419,385 | B2* | 9/2008 | Itou | H01R 12/724 |
| | | | | 439/76.1 |
| 7,911,771 | B2* | 3/2011 | DiFonzo | H05K 5/0086 |
| | | | | 361/679.01 |
| 8,772,635 | B2 | 7/2014 | Chen et al. | |
| 8,902,599 | B2 | 12/2014 | Chao et al. | |
| 9,565,780 | B2* | 2/2017 | Nishio | H05K 5/0069 |
| 9,831,578 | B2* | 11/2017 | Mizuguchi | H01R 13/4361 |
| 9,867,276 | B2* | 1/2018 | Gwin | G06F 1/181 |
| 9,967,993 | B1* | 5/2018 | Walker | H05K 7/1418 |
| 10,383,253 | B1* | 8/2019 | Mujcinovic | H05K 3/284 |
| 2003/0048611 | A1* | 3/2003 | Skofljanec | B60R 16/0239 |
| | | | | 361/704 |
| 2007/0020981 | A1* | 1/2007 | Matsuo | H05K 5/0039 |
| | | | | 439/264 |
| 2007/0211441 | A1* | 9/2007 | Wang | H05K 7/20409 |
| | | | | 361/752 |
| 2010/0202111 | A1 | 8/2010 | Liang | |
| 2015/0366086 | A1* | 12/2015 | Kajiwara | H01R 12/721 |
| | | | | 361/736 |
| 2016/0143158 | A1 | 5/2016 | Wakana et al. | |
| 2016/0249489 | A1* | 8/2016 | Wakana | H01R 12/721 |

FOREIGN PATENT DOCUMENTS

| | | |
|---|---|---|
| EP | 3054534 A1 | 8/2016 |
| TW | M449909 U1 | 4/2013 |
| WO | 94/09512 A1 | 4/1994 |
| WO | 2005/075253 A1 | 8/2005 |

\* cited by examiner

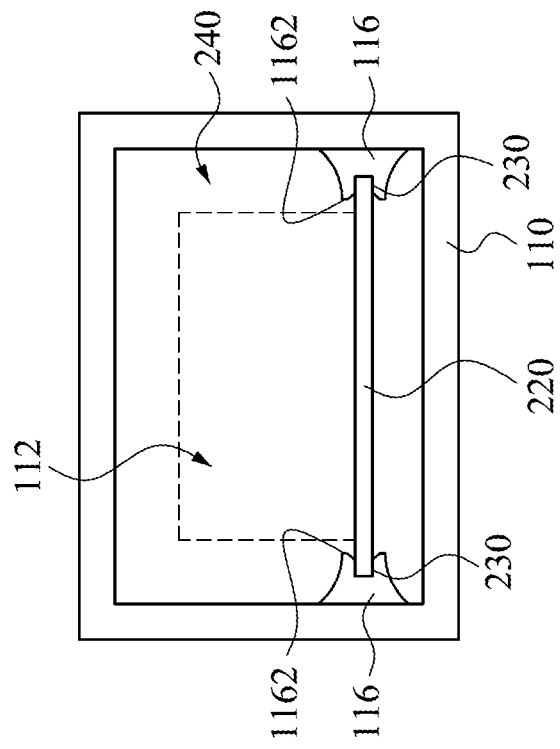
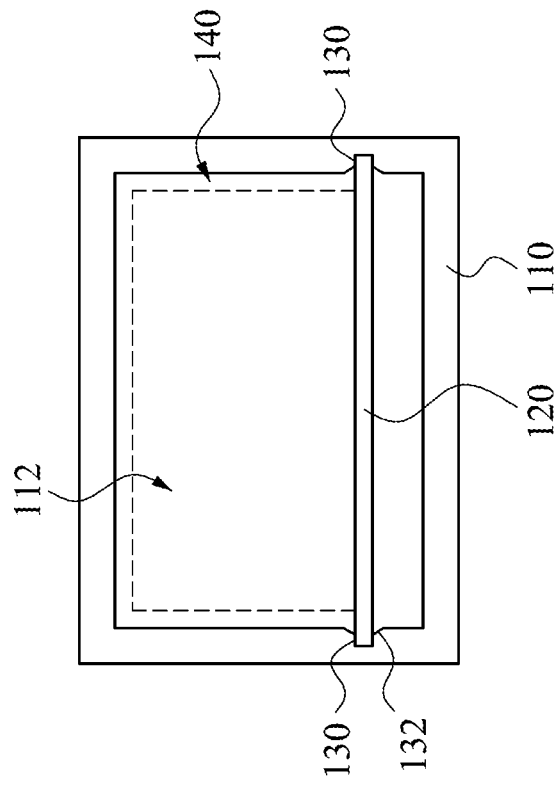
Fig. 4
Fig. 3

POWER SUPPLY DEVICE WITH PCB POSITIONING FUNCTION AND METHOD FOR MANUFACTURING THE SAME

CROSS-REFERENCE TO RELATED APPLICATION

This application claims priority to China Application Serial Number 201810569836.1, filed on Jun. 5, 2018, which is herein incorporated by reference in its entirety.

BACKGROUND

Field of Invention

The present disclosure relates to a power supply device, and more particularly, to an outdoor power supply device having a function of positioning a PCB (Printed Circuit Board) therein.

Description of Related Art

As outdoor activities have become more and more popular these days, demands of outdoor power supplies are drastically increased. In addition to the considerations of structural strength, insulation, and heat dissipation, waterproof and dustproof functions are also desirable for the outdoor power supplies because of various weather conditions. For instance, an outdoor power supply device is sometimes used in bad weather or harsh environment. If water droplets caused by heavy rain or harsh environment leak into the outdoor power supply device, the water droplets are very likely to cause damage to the interior of the outdoor power supply device and which may result in a malfunction of the outdoor power supply device.

Currently, various structural designs of conventional outdoor power supply devices have been presented to the market. However, each of the conventional outdoor power supply devices merely includes a housing, a waterproof gasket, a silicone gel, an insulating sheet and a metal cap. When the conventional outdoor power supply devices are assembled, due to lack of designs for positioning their internal components, the internal components are likely to collide with each other and thus are damaged.

Some conventional outdoor power supply devices use silicone gel for internal waterproof and heat dissipation. However, when the silicone gel is injected into the interior of the outdoor power supply device, due to lack of design features for positioning the internal components, the internal components are likely to be moved by the silicone gel. Hence, various issues, such as the internal components being squashed together and the insulation deterioration, may occur to the outdoor power supply device. Furthermore, although the silicone gel may facilitate interior heat dissipation of the conventional outdoor power supply devices, the silicone gel is also apt to cause high-temperature induced stress strain due to its thermosetting property. This characteristic could lead to damages to the internal components of the conventional outdoor power supply devices and reducing its performance.

Hence, it is desirable to provide a power supply device that is capable of tackling the aforementioned problems.

SUMMARY

In view of the foregoing, aspects of present disclosure seek to provide a power supply device with PCB-positioning features and thermoplastic gel provided therein and also to provide a method for manufacturing the power supply device, which may effectively overcome the above-mentioned problems faced by the conventional outdoor power supply devices.

In some embodiments of the present disclosure, a power supply device is provided and includes a casing, a printed circuit board (PCB), and at least one pair of slots. The casing has an accommodating space and at least one opening. The PCB has a plurality of electronic elements thereon and is disposed in the accommodating space. The at least one pair of slots is disposed at inner walls of the casing and configured to engage the PCB for positioning the PCB. A gel-fillable channel is defined between the electronic elements and the inner walls of the casing.

In some embodiments, the at least one pair of slots is at least one pair of grooves extending along the inner walls of the casing.

In some embodiments, at least one of the at least one pair of slots includes a chamfered edge.

In some embodiments, the inner walls of the casing include at least one pair of protruded portions and each of the at least one pair of slots is disposed on each of the protruded portions. The protruded portions include lips extending from the inner walls. The slots form openings of the lips.

In some embodiments, a width of the gel-fillable channel is equal to or more than 5 millimeters (mm).

In some embodiments, the power supply device further includes a gel portion provided between the electronic elements and the casing.

In some embodiments, the gel portion includes a thermoplastic gel.

In some embodiments, a viscosity coefficient of the thermoplastic gel is smaller than 2,000 centipoises (cp).

In some embodiments, the thermoplastic gel is asphalt.

In some embodiments, the power supply device further includes a sealing module that seals the accommodating space. The sealing module includes a sealing board and a protrusion. The sealing board covers the at least one opening. The protrusion extends from the sealing board towards the accommodating space and is configured to position the PCB.

In some embodiments, the PCB further includes a resilient grounding unit extending between the PCB and the casing so as to electrically connect the casing.

In some embodiments, the resilient grounding unit includes two resilient portions joined and collectively forming an inverted L-shape. A first portion extends towards the PCB. A second portion extends towards and abuts against an inner wall of the casing.

Additionally, in some embodiments of the present disclosure, a method for manufacturing a power supply device is provided and includes the steps of positioning a power supply module in a casing; heating and transforming a thermoplastic gel to a liquid thermoplastic gel; and injecting the liquid thermoplastic gel into the gel-fillable channel. The gel-fillable channel is formed between the power supply module and inner walls of the casing.

In some embodiments, the method further includes enclosing the casing with at least one sealing module. The sealing module includes a protrusion and a through hole. The protrusion is configured to engage with and position the power supply module in the casing. The through hole is configured for injecting the liquid thermoplastic gel into the gel-fillable channel.

In some embodiments, the thermoplastic gel has a viscosity coefficient of less than about 2,000 centipoises (cp). Additionally, the method further includes flowing the liquid thermoplastic gel over the power supply module.

Further herein described, according to one or more embodiments of the power supply device of the present disclosure, the at least one pair of slots is disposed at the inner walls of the casing to position the PCB, such that the PCB may maintain safety distances with respect to the inner walls of the casing in the vertical (e.g., up-and-down) and the horizontal (e.g., left-and-right) directions. The protrusion extended from the sealing board may also be used for positioning the PCB, such that the PCB may maintain another safety distance with respect to the sealing board in the horizontal (e.g., front-and-rear) direction. Since the PCB may maintain the safety distances in the vertical and horizontal directions respectively, the embodiments may allow for not requiring disposing insulating sheets between the PCB and the inner walls of the casing, or between the PCB and the sealing board. Furthermore, the aforementioned safety distances in the vertical and horizontal directions may also act as the gel-fillable channel, which may allow gels with low viscosity coefficients and thermoplastic properties to flow therein and further spread over the electronic elements on the PCB. Due to the formation of the gel-fillable channel, the gels with low viscosity coefficients may smoothly fill the accommodating space of the casing. Also, due to the use of the gels with thermoplastic properties, the problem of high-temperature induced stress strain due to the gels with thermosetting properties may also be prevented. Therefore, the above-mentioned structural configurations of the present disclosure may provide a desirable solution to the above-mentioned problems confronted by the conventional outdoor power supply devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. The dimensions of the various features may be arbitrarily increased or reduced for clarity of discussion.

FIG. 3 is a schematic front view of at least one pair of slots in a power supply device in accordance with one embodiment of the present disclosure.

FIG. 4 is a schematic front view of at least one pair of slots in a power supply device in accordance with another embodiment of the present disclosure.

DETAILED DESCRIPTION

Figure 1:
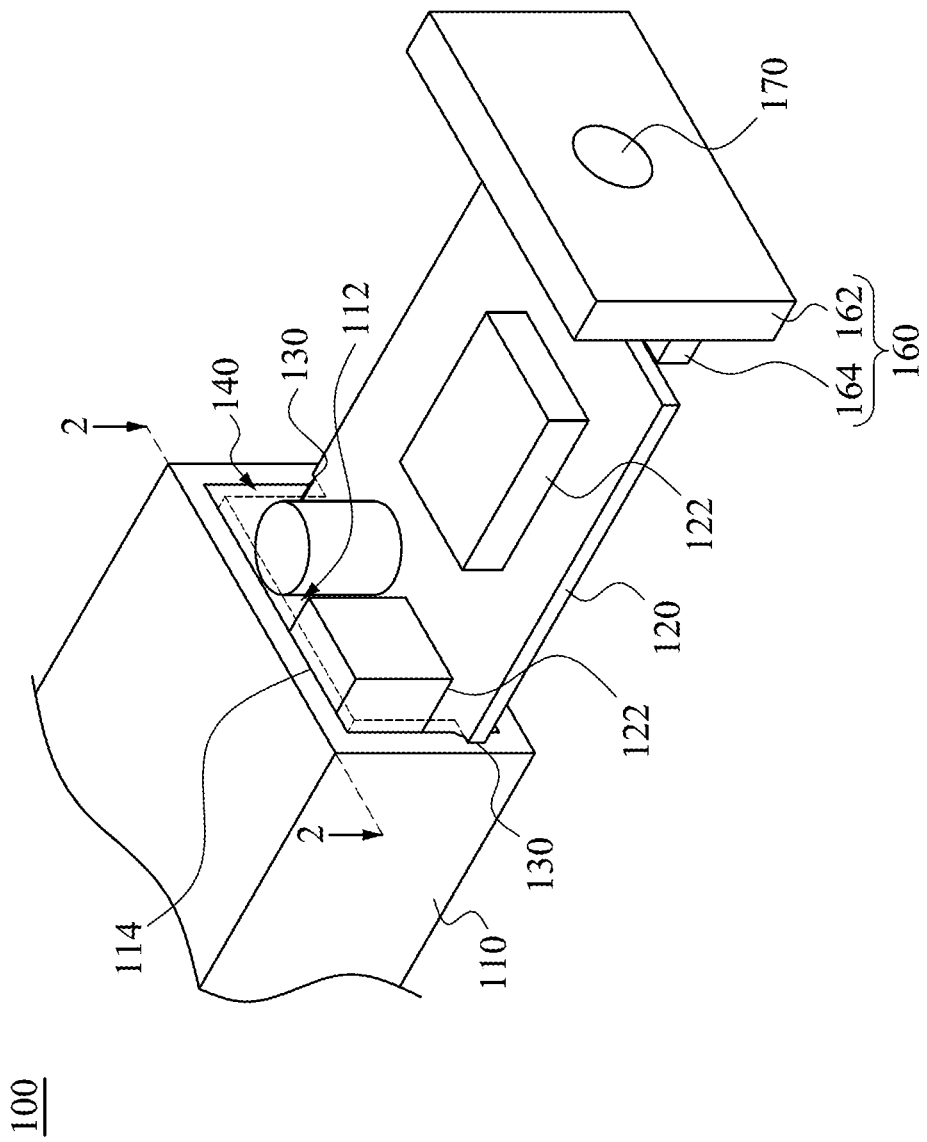
FIG. 1 is a partial perspective view of a power supply device in accordance with one embodiment of the present disclosure.

The following disclosure provides various embodiments, or examples, for implementing various features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about", "substantially" or "approximately" shall generally mean within 20 percent, within 10 percent, or within 5 percent of a given value or range. Numerical quantities given herein are approximate, so that the term "around", "about", "substantially" or "approximately" can be inferred if not expressly stated.

Reference is made to FIG. 1, which is a partial perspective view of a power supply device 100 in accordance with one embodiment of the present disclosure. The power supply device 100 includes a casing 110, a PCB 120, and at least one pair of grooves 130. The casing 110 defines an accommodating space 112 and has an opening 114. The PCB 120 is disposed in the accommodating space 112 and has electronic elements 122 thereon. The at least one pair of grooves 130 is disposed at inner walls of the casing 110 and configured to position the PCB 120. The electronic elements 122 and the inner walls of the casing 110 collectively define a gel-fillable channel 140 therebetween.

More specifically, according to one embodiment of the present disclosure, the casing 110 has an opening 114 at one end thereof. The PCB 120 and the electronic elements 122 thereon may be placed into or taken out of the accommodating space 112 via the opening 114. When the PCB 120 is placed in the accommodating space 112, the pair of grooves 130 formed on the inner walls of the casing 110 substantially sandwiches and fixes the PCB 120. Therefore, the PCB 120 may be stably settled in the accommodating space 112.

Simultaneously, since the power supply device 100 may position the PCB 120 through the pair of grooves 130 extending along the inner walls of the casing 110, the electronic elements 122 may allow for safety distances with respect to the inner walls of the casing 110 in the vertical and the horizontal directions. When the safety distances are greater than or equal to 5 millimeters (mm), insulating elements (e.g., solid insulating sheets) between the electronic elements 122 and the inner walls of the casing 110 are not needed for insulating the two from each other. Therefore, this structural configuration may simplify the manufacturing method of the power supply device 100 and also reduce the manufacturing cost thereof. However, it should be noted that the positions of the pair of grooves 130 on the inner walls of the casing 110 are not limited by the present embodiment, i.e., the pair of grooves 130 may be disposed at any relative position on the inner walls of the casing 110 based on various designs.

As shown in FIG. 1, the power supply device 100 also includes a sealing module 160. The sealing module 160 includes a sealing board 162 and a protrusion 164. The sealing board 162 is configured to cover the opening 114. The protrusion 164 extends from the sealing board 162 towards the accommodating space 112 for positioning the PCB 120. When two sides of the PCB 120 are fully inserted into the pair of grooves 130, the power supply module (including the PCB 120 and the electronic elements 122 thereon) may also correspondingly be fully placed into the accommodating space 112. Further, the sealing board 162 correspondingly covers the opening 114 and allows the accommodating space 112 to be isolated from the external environment, such that the power supply device 100 may achieve waterproof and dustproof functions.

On the other hand, since the power supply device 100 may also position the PCB 120 through the protrusion 164 extending from the sealing board 162, the PCB 120 and the electronic elements 122 thereon may allow for safety distances with respect to the sealing board 162. Similarly, for embodiments wherein the safety distances are greater than or equal to 5 millimeters (mm), insulating elements between the electronic elements 122 and the inner walls of the sealing board 162 may not be needed for insulating the two from each other. Therefore, this structural configuration substantially has the same advantages as those with respect to the safety distances of the grooves 130 described above. It should be noted that the position of the protrusion 164 on the sealing board 162 is not limited by the present embodiment, e.g., the position of the protrusion 164 may be correspondingly configured with respect to the positions of the grooves 130.

In addition, the power supply device 100 also includes a through hole 170. The through hole 170 is disposed on the sealing board 162. Hence, a power cord (not shown) may be connected between external devices and the electronic elements 122 via the through hole 170, or gels (for example, gels having low viscosity coefficients and thermoplastic properties) may be injected into the accommodating space 112 via the through hole 170. It should be noted that the position of the through hole 170 on the sealing board 162 is not limited by the present embodiment.

Figure 2:
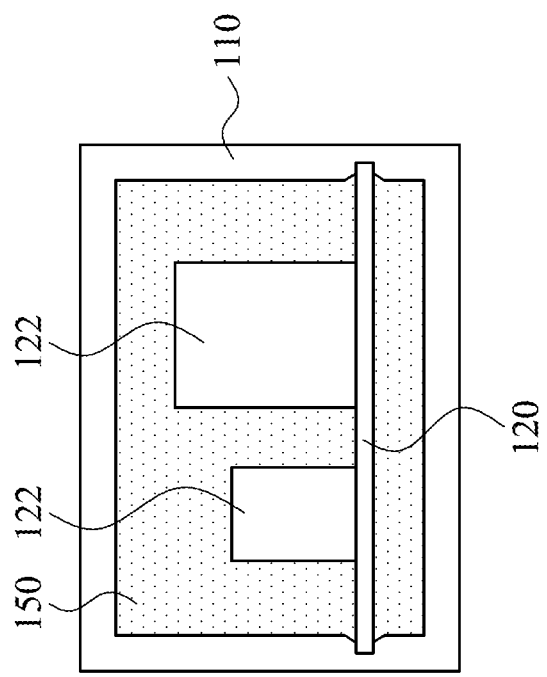
FIG. 2 a schematic cross-sectional view of the power supply device in FIG. 1 viewed along a segment 2-2 as indicated in FIG. 1.

References are made to FIGS. 1 and 2 together, wherein FIG. 2 is a schematic cross-sectional view of the power supply device 100 in FIG. 1 viewed along a segment 2-2 as indicated in FIG. 1. When the aforementioned safety distances are provided, the safety distances may also present as the gel-fillable channel 140. In some embodiments, the width of the gel-fillable channel 140 is preferably not less than 5 millimeters (mm) for enhancing insulation. The gel-fillable channel 140 may allow the gels (for example, gels with low viscosity coefficients and thermoplastic properties) to flow therein and spread over the electronic elements on the PCB 120, such that a gel portion 150 may be formed between the electronic elements 122 and the inner walls of the casing 110. The gel portion 150 filling the accommodating space 112 may provide further waterproof, dustproof and heat dissipation effects to the power supply device 100.

More specifically, according to one or more embodiments, the gel portion 150 includes a thermoplastic gel, and furthermore, is formed from a thermoplastic gel with a viscosity coefficient smaller than 2,000 centipoises (cp). After the thermoplastic gel is injected into the accommodating space 112 and fills the same, the thermoplastic gel may directly cover the electronic elements 122, such that the heat generated during the operation of the power supply device 100 may transfer to the casing 110 and further diffuse to its surrounding environment. In the meantime, the thermoplastic gel completely covering the electronic elements 122 may also provide waterproof, dustproof and insulation protections to the power supply device 100.

It is noted that gels used in the conventional power supply devices are thermosetting gels, such as silicone gels. Hence, when the conventional power supply devices are in operation or under a high-temperature environment, the silicone gel filling the interior of the conventional power supply devices often causes high-temperature induced stress strain which may damage components in the conventional power supply devices, e.g., damaging the wirings between the electronic elements and the circuit board. However, the gel used in the power supply device 100 of the present disclosure is preferably a thermoplastic gel. Therefore, when the power supply device 100 is in operation or under a high-temperature environment, the thermoplastic gel does not result in the high-temperature induced stress strain. This feature may have the advantage of effectively improving the reliability of the power supply device 100 and enhancing its stability under a high-temperature environment.

It should be noted that the general standard for determining if a gel has a high or low fluidity lies in whether its viscosity coefficient is higher or lower than 2,000 centipoises (cp). A gel with a viscosity coefficient higher than 2,000 centipoises has a higher and better fluidity, and vice versa. For example, the viscosity coefficient of silicone gel under a room temperature is about 3,000 to 5,000 centipoises, and thus the silicone gel has a better fluidity. The viscosity coefficient of asphalt under a similar room temperature is about 1,000 centipoises, and thus the asphalt has a poorer fluidity.

In some embodiments, the gel portion 150 is formed from asphalt. More specifically, the asphalt has a poorer fluidity as described above while simultaneously having an excellent thermal conductivity together with a thermoplastic property. For forming the gel portion 150, the asphalt with a poorer fluidity is injected into the gel-fillable channel 140. Since the gel-fillable channel 140 has a sufficiently large space, the injected asphalt may smoothly pass through the gel-fillable channel 140 and gradually fill the accommodating space 112. Hence, the gel portion 150 may be formed between the electronic elements 122 and the inner walls of the casing 110.

Reference is made to FIG. 3, which is a schematic front view of at least one pair of slots in the power supply device 100 in accordance with one embodiment of the present disclosure. As shown in FIG. 3, a pair of grooves 130 is formed on the inner walls of the casing 110 as a pair of slots for receiving and positioning the PCB 120, and more particularly, the inner walls of the casing 110 are recessed outwardly to form the pair of grooves 130. The grooves 130 have rectangular cross sections. In some embodiments, at least one of the at least one pair of slots (e.g., the grooves 130) includes a chamfered edge 132. For example, the intersections of the rectangular cross sections and the inner walls of the casing 110 may be chamfered to form a plurality of chamfered edges 132 as shown in FIG. 3. In some embodiments, in addition to the intersections, corners of the rectangular cross sections may also be chamfered. It should be noted that the shape of the intersections and corners may be adjusted based on various designs, e.g., the intersections and corners may also be rounded.

Additionally, the cross sections of the grooves 130 of the present disclosure are not limited by the present embodiment and may be adjusted according to the contour of the PCB 120, e.g., the cross section of the grooves 130 may resemble a slotted hole or trench. Therefore, the PCB 120 may be stably positioned in the accommodating space 112 by the pair of grooves 130. Consequently, the gel-fillable channel 140 is formed between the electronic elements 122 (shown in FIG. 2) on the PCB 120 and the inner walls of the casing 110.

Reference is made to FIG. 4, which is a schematic front view of at least one pair of slots in a power supply device 100A in accordance with another embodiment of the present disclosure. As shown in FIG. 4, a pair of grooves 230 is formed on the inner walls of the casing 110 as a pair of slots for receiving and positioning the PCB 120. More particularly, at least one pair of protruded portions 116 is located on the inner walls of the casing 110 respectively. The pair of grooves 230 is disposed on the protruded portions 116 respectively. In some embodiments, the protruded portions 116 include lips 1162 extending from the inner walls of the casing 110. The lips 1162 have openings forming the grooves 230 for engaging with the PCB 220. It should be noted that the grooves 230 substantially have the same shape feature as the grooves 130 described in the embodiment shown by FIG. 3, so that references may be made to the above-mentioned related descriptions and those descriptions in this regard will not be repeated hereinafter except for further explaining about the difference between the grooves 130 and the grooves 230.

Additionally, after the PCB 220 is fully positioned in the accommodating space 112 by the pair of grooves 230, the electronic elements 122 (shown in FIG. 2) on the PCB 220 and the inner walls of the casing 110 may consequently form a gel-fillable channel 240 therebetween. More specifically, the gel-fillable channel 240 substantially has a larger space in comparison with the gel-fillable channel 140 described in the above-mentioned embodiment. As shown in the FIGS. 3 and 4, the width of the PCB 220 is less than the width of the PCB 120. The grooves 230 formed by the openings of the lips 1162 extending from the inner wall of the casing 110 are configured to make the PCB 220 stably positioned in the accommodating space 112. Although this structural configuration of FIG. 4 may decrease the disposing space of the electronic elements 122, yet the gel-fillable channel 240 is enlarged, such that gels with poorer fluidity, e.g., the asphalt, may flow even more smoothly in the gel-fillable channel 240 and then fill the accommodating space 112. It should be noted that the size of the protruded portions 116 may be changed for adapting to PCBs with various dimensions (e.g., widths), such that the casing 110 may receive various types of PCBs through simple modifications of the protruded portions 116.

Figure 5:
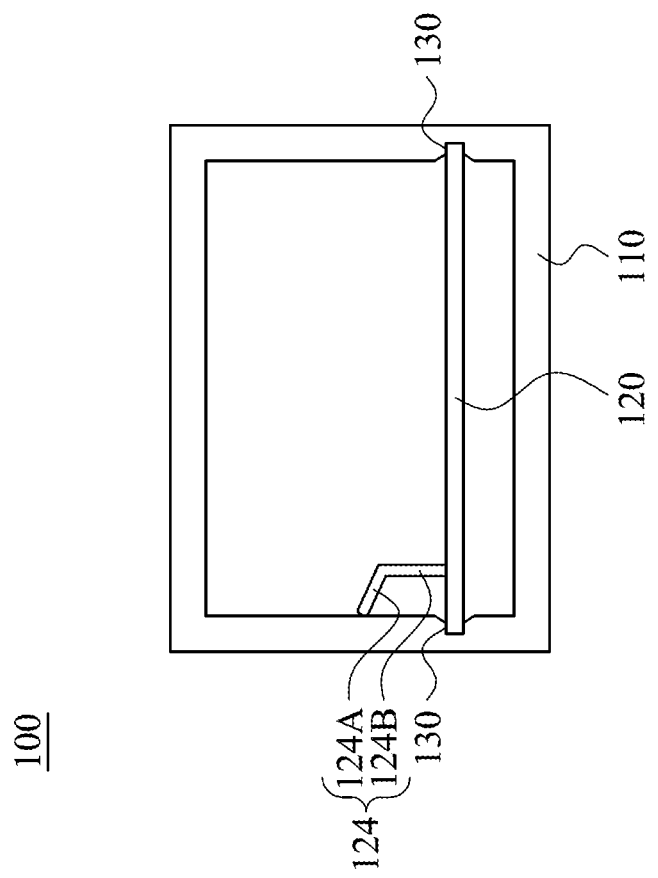
FIG. 5 is a schematic front view of a resilient grounding unit in a power supply device in accordance with one embodiment of the present disclosure.

Reference is made to FIG. 5, which is a schematic front view of a resilient grounding unit 124 in the power supply device 100 in accordance with one embodiment of the present disclosure. As shown in FIG. 5, the PCB 120 also includes the resilient grounding unit 124, which extends between the PCB 120 and the casing 110 so as to electrically connect the PCB 120 to the inner walls of the casing 110. With the configuration of the resilient grounding unit 124, the power supply device 100 does not need an additional grounding wire connected to the PCB 120 but may directly ground the PCB 120 via the resilient grounding unit 124. In some embodiments, the resilient grounding unit 124 has an inverted L-shaped cross section and is disposed on the peripheral area of the PCB 120. Further, the resilient grounding unit 124 may substantially have a two-segment structure, which includes an upper segment 124A and a lower segment 124B. The two segments may collectively form an obtuse angle therebetween, wherein the upper segment 124A is bent closer to the inner wall of the casing 110 relative to the lower segment 124B. Hence, the upper portion 124A extends towards and abuts against an inner wall of the casing 110 while the lower portion 124B extends towards the PCB 120. It should be noted that the angle between the upper segment 124A and the lower segment 124B is not limited by the present embodiment, e.g., the angle may also be an acute angle or a right angle.

In some embodiments, when the PCB 120 is partially positioned in the grooves 130 and the resilient grounding unit 124 is still outside the casing 110, the upper segment 124A may be partially overlapped with the casing 110 in the front view of the power supply device 100. Subsequently, after the PCB 120 is fully positioned in the grooves 130, the upper segment 124A may be pushed back by the inner wall of the casing 110, and thus being in constant and close contact with the inner wall of the casing 110 due to the material resilience of the resilient grounding unit 124. Therefore, the electrical connection between the resilient grounding unit 124 and the casing 110 may provide a stable engagement. Additionally, the resilient grounding unit 124 is made of metal materials with resilience, and thus having an excellent material resilience for achieving the aforementioned effects. It should be also noted that the position of the resilient grounding unit 124 of the present disclosure is not limited by the present embodiment, e.g., the resilient grounding unit 124 may also be disposed on the lower surface of the PCB.

Figure 6:
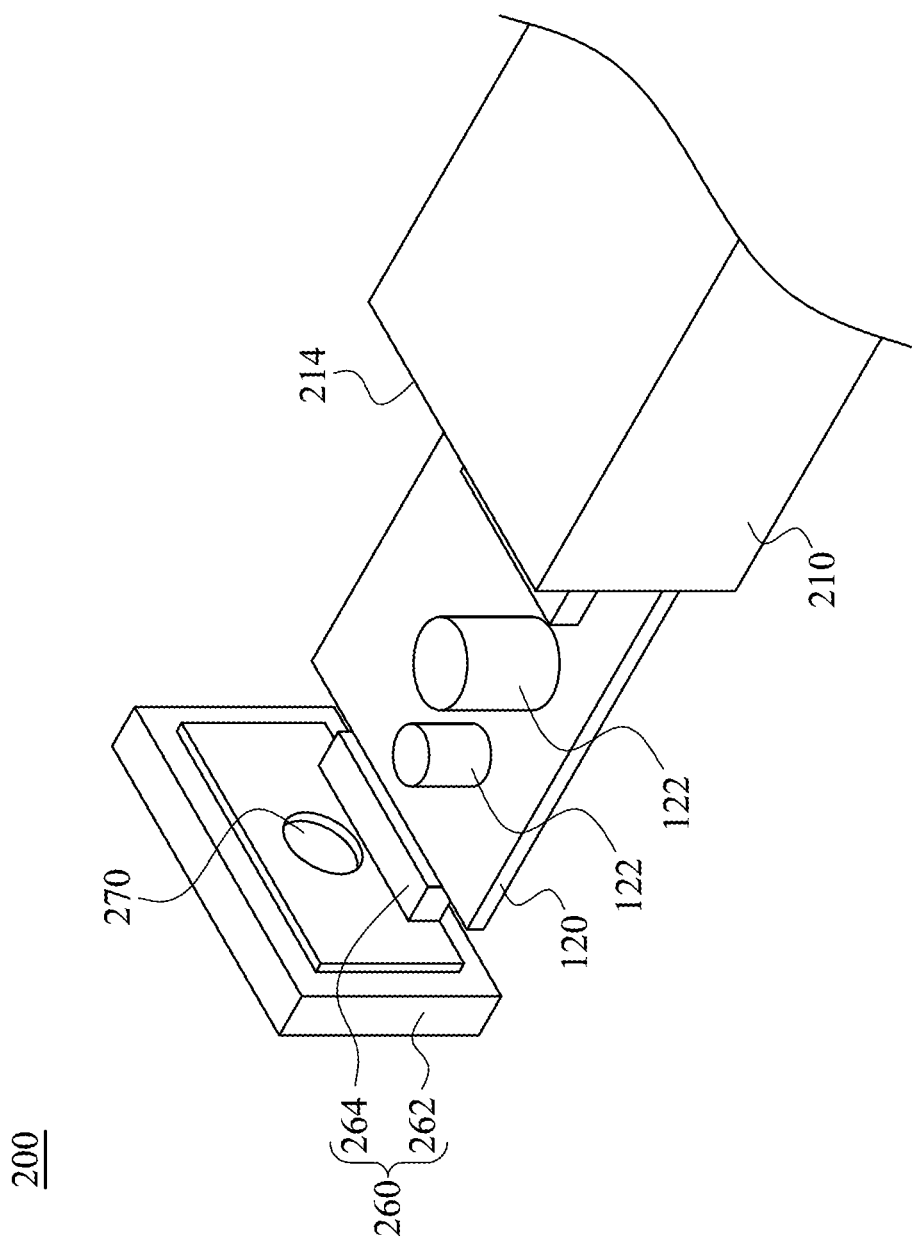
FIG. 6 is a partial perspective view of a power supply device in accordance with another embodiment of the present disclosure.

Reference is made to FIG. 6, which is a partial perspective view of a power supply device 200 in accordance with another embodiment of the present disclosure. The power supply device 200 includes a casing 210, a PCB 120, at least one pair of slots, and a sealing module. The casing 210 defines an accommodating space and has two openings at two ends thereof. The PCB 120 is disposed in the accommodating space and has electronic elements 122 thereon. The at least one pair of slots is disposed at inner walls of the casing 210 and configured to position the PCB 120. The electronic elements 122 and the inner walls of the casing 210 collectively define a gel-fillable channel therebetween. The sealing module covers an opening of the casing 210. It should be noted that, the PCB, the pair of slots, the accommodating space, the electronic elements, the gel-fillable channel, the gel portion and the sealing module are substantially the same as the corresponding elements illustrated in FIGS. 1 to 4, so that references may be made to the above-mentioned related descriptions and those descriptions in this regard will not be repeated hereinafter except for further explanations.

More specifically, in some embodiments, the casing 210 has two openings at two ends thereof. As shown in FIG. 6, the power supply device 200 includes another sealing module 260, which is substantially the same as the sealing module 160 illustrated in FIG. 1. The sealing module 260 includes a sealing board 262 and a protrusion 264. The sealing board 262 covers the opening 214 of the casing 210. It should be noted that, the sealing board 262 and the protrusion 264 are substantially the same as those corresponding elements illustrated in FIG. 1, so that references may be made to the above-mentioned related descriptions and those descriptions in this regard will not be repeated hereinafter except for further explanations. In particular, the power supply device 200 may utilize the protrusion 164 of the sealing module 160 and the protrusion 264 of the sealing module 260 to firmly sandwich the PCB 120 between the two openings of the casing 210. Hence, the PCB 120 may allow for safety distances with respect to the sealing board 162 and the sealing board 262. It should be also noted that the descriptions regarding the safety distance can be referred to the related descriptions stated in FIG. 1 and will not be repeated hereinafter.

In some embodiments, the power supply device 200 includes another through hole 270. The though hole 270 is formed on the sealing board 262. Due to the configuration of the through hole 270, a power cord (not shown) may be connected between external devices and the electronic elements 122 via the through hole 270, or the gels with low viscosity coefficients and thermoplastic properties may be injected into the accommodating space via the though hole 270. That is, the through hole 270 substantially has the same function as the through hole 170 illustrated in FIG. 1, so that references may be made to the above-mentioned related descriptions to further understand the configuration of the through hole 270. It should be noted that, the two through holes in the present embodiment may be selectively configured, i.e., only one or both of the two through holes may be provided. Therefore, the configuration of the two through holes may be adjusted according to various envisaged designs.

It should be further noted that, in some embodiments, a platform may be formed on the inner wall of the sealing board that faces the accommodating space. The outline of the platform conforms to and is slightly smaller than the cross section of the inner walls of the accommodating space. By combining the sealing board and the casing, the platform may be embedded in the accommodating space through the opening, such that the effect of sealing may be enhanced. Additionally, a sealant like an O-ring may also be provided between the sealing board and the casing so as to further enhance the effect of sealing.

Figure 7:
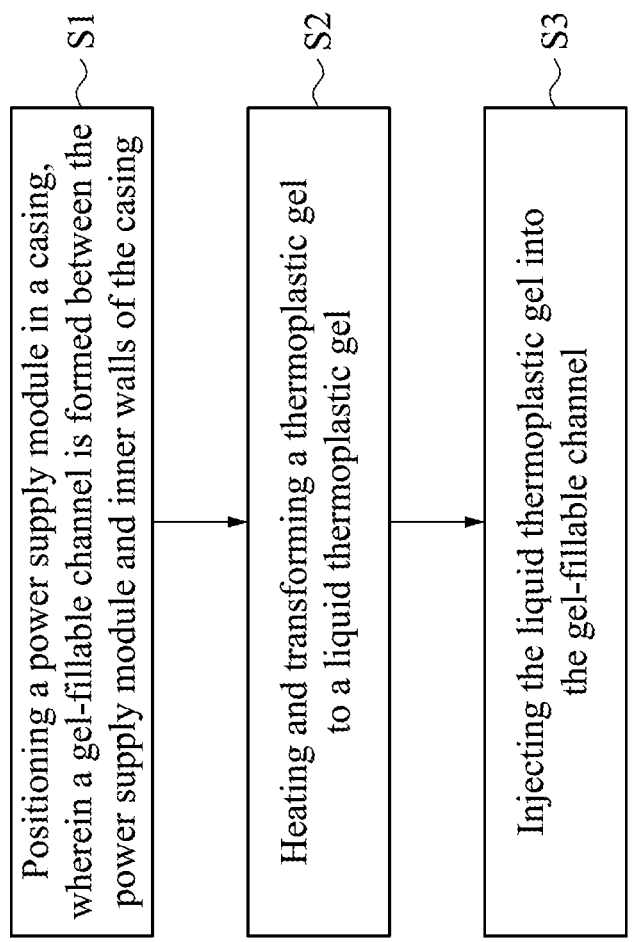
FIG. 7 is a flowchart illustrating a method for manufacturing a power supply device in accordance with one or more embodiments of the present disclosure.

Reference is made to FIG. 7, which is the flowchart illustrating a method for manufacturing a power supply device in accordance with one or more embodiments of the present disclosure. The manufacturing method includes three main steps S1, S2, and S3 described as follows.

Step S1 is performed for positioning a power supply module in a casing. More specifically, after two sides of a PCB are slid into a pair of slots, the power supply module (including the PCB and electronic elements thereon) may be aligned in the vertical and the horizontal directions via the pair of slots. Subsequently, sealing modules are configured to cover corresponding openings of the casing, such that protrusions of the sealing modules may be used to align the PCB between the openings. After the aforementioned alignments are completed, a gel-fillable channel is formed between the power supply module and inner walls of the casing.

Step S2 is performed for heating and transforming a thermoplastic gel to a liquid thermoplastic gel. For example, asphalt with a low fluidity may be heated and transformed into the liquid phase thereof (liquid thermoplastic gel).

Step S3 is performed for injecting the liquid thermoplastic gel into the gel-fillable channel. Specifically, the liquid thermoplastic gel may smoothly flow through the gel-fillable channel between the power supply module and the inner walls of the casing, such that the interior of the casing is gradually filled and the PCB and the electronic elements thereon are also covered.

It should be noted that the manufacturing method of the present disclosure is merely used to present three steps of the manufacturing process and not intended to be limiting. The configurations of said or other relative components may be adjusted based on various designs by those skilled in the art. For example, the method may further include enclose the casing with at least one sealing module. In some embodiments, after the interior of the casing is filled with the liquid thermoplastic gel, the sealing modules are then configured to cover the openings of the casing. In some embodiments, one of the sealing modules is firstly configured to cover one opening of the casing, and the other of the sealing module is then configured to cover the other opening of the casing after the interior of the casing is filled with the liquid thermoplastic gel.

According to the detailed descriptions above with respect to various embodiments of the present disclosure, it may be understood that, the at least one pair of slots is disposed at the inner walls of the casing to position the PCB, such that the PCB may allow for safety distances with respect to the inner walls of the casing in the vertical and the horizontal directions. The protrusions extended from the sealing boards may also position the PCB, such that the PCB may allow for another safety distance with respect to the sealing boards. Since the PCB may allow for the safety distances with respect to the inner walls of an enclosed casing, there is no need to set insulating sheets between the PCB and the inner walls of the casing and/or between the PCB and the sealing board. Furthermore, the aforementioned safety distances may also act as the gel-fillable channel, which may make gels with low viscosity coefficients and thermoplastic properties flow therein and further spread over the electronic elements on the PCB. By providing the gel-fillable channel, the gels with low viscosity coefficients may fill the accommodating space of the casing quicker and smoother. With the use of the gels with thermoplastic properties, the problem of high-temperature induced stress strain as a result of the gels with thermosetting properties may also be alleviated. The above-mentioned structural configurations of the present disclosure may substantially decrease the difficulty of assembling the power supply device, reduce the manufacturing cost of the power supply device, and minimize damages caused by the high-temperature induced stress strain as a result of the gels with thermosetting properties. Accordingly, the present disclosure may provide an effective solution to the above-mentioned problems confronted by the conventional outdoor power supply devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the scope of the present disclosure, and it is envisaged that various changes, substitutions, and alterations may be made.

What is claimed is:

1. A power supply device, comprising:
a casing having an accommodating space defined by inner walls of the casing, wherein the inner walls comprise two opposite inner side walls and the accommodating space is located between the inner side walls;
a printed circuit board (PCB) having a plurality of electronic elements thereon and being disposed in the accommodating space;
a gel-fillable channel defined between the electronic elements and the inner walls of the casing, wherein a width of the gel-fillable channel is equal to or more than about 5 millimeters (mm); and
two elongate slots, each disposed at one of the inner side walls and configured to engage a peripheral side of the PCB for positioning the PCB,
wherein the inner side walls extend toward the PCB and chamfer from faces of the inner side walls towards the peripheral sides of the PCB to form chamfered edges and the elongate slots;
wherein one of the elongate slots on one of the inner side walls has a bottom surface and a pair of side surfaces, the bottom surface contacts the peripheral side of the PCB, the pair of side surfaces contact opposing faces of the PCB respectively, the chamfered edges on the one of the inner side walls are spaced apart from the bottom surface and are connected to the side surfaces respectively.

2. The power supply device of claim 1, wherein the elongate slots are grooves extending along the inner walls of the casing.

3. The power supply device of claim 1, further comprising a sealing module, the sealing module comprising:
a sealing board covering an opening of the casing to seal the accommodating space; and
a protrusion extending from the sealing board towards the accommodating space and configured to position the PCB.

4. The power supply device of claim 1, wherein the elongate slots are elongated in a first direction corresponding to the peripheral sides of the PCB, and wherein directions which the inner side walls chamfer from the faces of the inner side walls towards the peripheral sides of the PCB are orthogonal to the first direction.

5. The power supply device of claim 1, wherein the elongate slots contact to engage the PCB at a contact region of the peripheral side of the PCB, and wherein portions of the inner side walls chamfering from the faces of the inner side walls towards the peripheral sides of the PCB provide a non-contact region adjacent to the contact region, and wherein both the contact region and the non-contact region extend correspondingly to the elongate slots.

6. The power supply device of claim 1, wherein the chamfered edges extend along the elongate slots.

7. The power supply device of claim 1, wherein the inner side walls extend towards the PCB to form protruded portions of the inner side walls and chamfer from the protruded portions towards the PCB to form lips of the elongated slots, and wherein an opening of the lips is configured to engage with the peripheral side of the PCB.

8. A power supply device, comprising:
a casing having an accommodating space defined by inner walls of the casing, wherein the inner walls comprise two opposite inner side walls, and the accommodating space is located between the inner side walls;
a printed circuit board (PCB) having a plurality of electronic elements thereon and being disposed in the accommodating space; and
two elongate slots disposed at the two inner side walls respectively, the two elongate slots being configured to engage a first peripheral side and a second peripheral side of the PCB respectively;
wherein one of the elongate slots comprises an engaging portion and a chamfered portion, the engaging portion contacting the first peripheral side of the PCB, and the chamfered portion being connected between the engaging portion and one of the inner side walls, wherein the chamfered portion and the PCB are separated by a gap therebetween, and wherein the gap tapers towards the engaging portion in a direction pointing from the second peripheral side towards the first peripheral side;
wherein the engaging portion has a bottom surface and a pair of side surfaces, the bottom surface contacts the first peripheral side of the PCB, the pair of side surfaces contact opposing faces of the PCB respectively, the chamfered portion is spaced apart from the bottom surface and is connected to one of the side surfaces;
wherein a gel-fillable channel is defined between the electronic elements and the inner walls of the casing, and a width of the gel-fillable channel is equal to or more than about 5 millimeters (mm).

9. The power supply device of claim 8, wherein the elongate slots are grooves extending along the inner walls of the casing.

10. The power supply device of claim 8, further comprising a sealing module, the sealing module comprising:
a sealing board covering an opening of the casing to seal the accommodating space; and
a protrusion extending from the sealing board towards the accommodating space and configured to position the PCB.

11. A power supply device, comprising:
a casing having an accommodating space defined by inner walls of the casing, wherein the inner walls comprise two opposite inner side walls, and the accommodating space is located between the inner side walls;
a printed circuit board (PCB) having a plurality of electronic elements thereon and being disposed in the accommodating space; and
two elongate slots disposed at the two inner side walls respectively, the two elongate slots being configured to engage a first peripheral side and a second peripheral side of the PCB respectively;
wherein one of the elongate slots comprises an engaging portion and a chamfered portion, the engaging portion contacting the first peripheral side of the PCB, the chamfered portion being connected between the engaging portion and one of the inner side walls, and the chamfered portion chamfering from a face of the inner side walls towards the first peripheral side of the PCB, wherein the chamfered portion and the PCB are separated by a gap therebetween, and wherein the gap tapers towards the engaging portion in a direction pointing from the second peripheral side towards the first peripheral side;
wherein the engaging portion has a bottom surface and a pair of side surfaces, the bottom surface contacts the first peripheral side of the PCB, the pair of side surfaces contact opposing faces of the PCB respectively, the chamfered portion is spaced apart from the bottom surface and is connected to one of the side surfaces;

wherein a gel-fillable channel is defined between the electronic elements and the inner walls of the casing, and a width of the gel-fillable channel is equal to or more than about 5 millimeters (mm).

12. The power supply device of claim 11, wherein the elongate slots are grooves extending along the inner walls of the casing.

13. The power supply device of claim 11, further comprising a sealing module, the sealing module comprising:
- a sealing board covering an opening of the casing to seal the accommodating space; and
- a protrusion extending from the sealing board towards the accommodating space and configured to position the PCB.

* * * * *